(12) United States Patent
Ono et al.

(10) Patent No.: US 8,575,824 B2
(45) Date of Patent: Nov. 5, 2013

(54) PIEZOELECTRIC GENERATOR, SENSOR NODE, AND METHOD OF MANUFACTURING PIEZOELECTRIC GENERATOR

(75) Inventors: Yasuhiro Ono, Matsumoto (JP); Atsuya Hirabayashi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 29 days.

(21) Appl. No.: 13/238,778

(22) Filed: Sep. 21, 2011

(65) Prior Publication Data

US 2012/0091859 A1    Apr. 19, 2012

(30) Foreign Application Priority Data

Oct. 13, 2010 (JP) ................................. 2010-230299

(51) Int. Cl.
*H01L 41/113* (2006.01)
(52) U.S. Cl.
USPC ............ 310/339; 310/338; 310/346; 310/348
(58) Field of Classification Search
USPC .................. 310/328, 338, 339, 346, 348–351
See application file for complete search history.

(56) References Cited

U.S. PATENT DOCUMENTS

| | | | | |
|---|---|---|---|---|
| 4,287,447 A | * | 9/1981 | Skoda et al. ................... | 310/348 |
| 4,990,817 A | * | 2/1991 | Hamuro ......................... | 310/348 |
| 6,252,336 B1 | * | 6/2001 | Hall .............................. | 310/339 |
| 6,812,622 B2 | * | 11/2004 | Matsuyama et al. .......... | 310/344 |
| 7,952,248 B2 | | 5/2011 | Ono | |
| 2006/0000263 A1 | * | 1/2006 | Su et al. ........................... | 73/105 |
| 2008/0157630 A1 | * | 7/2008 | Takahashi ...................... | 310/328 |
| 2011/0241792 A1 | * | 10/2011 | Kubota et al. .................. | 331/158 |

FOREIGN PATENT DOCUMENTS

| | | | | |
|---|---|---|---|---|
| JP | A-7-49388 | | 2/1995 | |
| JP | 10-22776 A | * | 1/1998 | |
| JP | A-10-2973 | | 1/1998 | |
| JP | A-11-18445 | | 1/1999 | |
| JP | 11-214947 A | * | 8/1999 | |
| JP | 2003-078373 A | * | 3/2003 | |
| JP | A-2010-136542 | | 6/2010 | |
| JP | 2010-263431 A | * | 11/2010 | |
| JP | A-2010-252509 | | 11/2010 | |
| JP | A-2011-4598 | | 1/2011 | |

* cited by examiner

*Primary Examiner* — Thomas Dougherty
(74) *Attorney, Agent, or Firm* — Oliff & Berridge, PLC

(57) ABSTRACT

A piezoelectric generator includes: a base body; and at least one piezoelectric transducer disposed on the base body, and including a first electrode, a piezoelectric body, and a second electrode, wherein the piezoelectric transducer includes a support section fixed to the base body, and a vibrating section disposed apart from the base body, having one end connected to the support section and the other end set as a free end, and vibrating due to a vibration applied externally, and a distance between the other end of the vibrating section and the base body is larger than a distance between the one end of the vibrating section and the base body.

14 Claims, 7 Drawing Sheets

PIEZOELECTRIC GENERATOR, SENSOR NODE, AND METHOD OF MANUFACTURING PIEZOELECTRIC GENERATOR

BACKGROUND

1. Technical Field

The present invention relates to a piezoelectric generator, a sensor node, and a method of manufacturing a piezoelectric generator.

2. Related Art

There has been known a piezoelectric generator provided with a cantilevered piezoelectric transducer, and generating electric energy due to the piezoelectric effect caused by the vibration of the piezoelectric transducer (see, e.g., JP-A-11-18445 (Document 1)). The piezoelectric generator described in Document 1 is provided with a support member disposed under the piezoelectric transducer (a first electrode, a piezoelectric thin film, and a second electrode), the support member having a deformable section deformed in accordance with the piezoelectric transducer, and a support section for supporting the deformable section. Such a piezoelectric generator is manufactured by depositing various layers such as a sacrificial layer, a support layer, two electrode layers, and a piezoelectric body layer on a silicon substrate using a low-pressure deposition process such as a sputtering process or a chemical vapor deposition process, and then patterning it using a photolithography process and an etching process.

There is proposed a sensor network having a number of sensor network terminals (hereinafter referred to as sensor nodes) provided with a communication function installed in various places to thereby form a network, and for collecting the data obtained by each of the sensor nodes. The sensor node, which is provided with a sensor, a circuit, a communication system, and a power source, is required to be small in size and low-profile so as to be easily installed in a variety of places, efficiently generate electricity and operate for a long period of time, and is further required to be provided at low price. As a power source of such a sensor node, use of the piezoelectric generator described above has been considered.

However, the piezoelectric generator described in Document 1 has a configuration that the support member intervenes under the piezoelectric transducer, and the deformable section of the support member vibrates in accordance with the piezoelectric transducer, and therefore, there arises a problem that it is difficult to achieve low-profiling. Since the manufacturing process of the piezoelectric generator requires an expensive vacuum (low-pressure) deposition device, and includes a complicated process using the photolithography process and the etching process, there arises a problem that cost reduction is difficult.

SUMMARY

An advantage of some aspects of the invention is to solve at least a part of the problem described above, and the invention can be implemented as the following forms or application examples.

APPLICATION EXAMPLE 1

This application example of the invention is directed to a piezoelectric generator including a base body, and at least one piezoelectric transducer disposed on the base body, and including a first electrode, a piezoelectric body, and a second electrode, wherein the piezoelectric transducer includes a support section fixed to the base body, and a vibrating section disposed apart from the base body, having one end connected to the support section and the other end set as a free end, and vibrating due to a vibration applied externally, and a distance between the other end of the vibrating section and the base body is larger than a distance between the one end of the vibrating section and the base body.

According to this configuration, it becomes possible to eliminate intervention of another layer on the lower side of the piezoelectric transducer having the support section and the vibrating section, the piezoelectric generator can be made low-profile compared to the case in which another layer intervenes on the lower side of the piezoelectric transducer. Since the other end of the vibrating section is located further than the one end thereof from the base body, the amplitude of the vibration of the vibrating section excited by the external vibration can be made larger compared to the case in which the distance from the base body is the same between the one end and the other end. Thus, the amount of the distortion caused in the piezoelectric transducer is increased, and therefore, the electric energy generated by the piezoelectric generator is increased. As a result, the piezoelectric generator, which is low-profile and efficiently generates electricity, can be provided.

APPLICATION EXAMPLE 2

According to this application example of the invention, in the piezoelectric generator according to the above application example of the invention, it is preferable that the base body is made of a material including a component the same as a component of the piezoelectric body.

According to this configuration, since the base body is made of the material including the same component as the component of the piezoelectric body, the piezoelectric generator can be manufactured by disposing the piezoelectric transducer to be fireed on the base body in the non-fireed state, and then fireing them together. On this occasion, the difference between the both layers in contraction rate in the fireation process is reduced, and at the same time, the diffusion of the impurities from the base body layer into the piezoelectric body layer is also reduced compared to the case in which the component of the base body and the component of the piezoelectric body are different from each other. Thus, generation of cracks and residual stress in the base body and the piezoelectric body due to the large difference in contraction rate, and deterioration in the piezoelectric characteristics of the piezoelectric body due to the diffusion of the impurities can be prevented. Since the base body to be fireed has flexibility, and can be formed to have an arbitrary shape, the freedom of installation can be enhanced compared to the case in which the base body is formed of a silicon substrate or the like.

APPLICATION EXAMPLE 3

According to this application example of the invention, in the piezoelectric generator according to the above application example of the invention, it is preferable that a thermal contraction rate of the first electrode is lower than a thermal contraction rate of the piezoelectric body.

According to this configuration, since the thermal contraction rate of the first electrode located on the base body side of the piezoelectric body is lower than the thermal contraction rate of the piezoelectric body, the piezoelectric body makes larger contraction than the first electrode when fireed. Therefore, in the piezoelectric transducer after the fireation, since the other end as the free end of the vibrating section bends to the opposite side to the base body side than the one end, the distance between the other end of the vibrating section and the base body can be set larger than the distance between the one end of the vibrating section and the base body.

APPLICATION EXAMPLE 4

According to this application example of the invention, in the piezoelectric generator according to the above application example of the invention, it is preferable that a thermal contraction rate of the second electrode is higher than a thermal contraction rate of the piezoelectric body.

According to this configuration, since the thermal contraction rate of the second electrode located on the opposite side to the base body side of the piezoelectric body is higher than the thermal contraction rate of the piezoelectric body, the second electrode makes larger contraction than the piezoelectric body when fireed. Therefore, in the piezoelectric transducer after the fireation, since the other end as the free end of the vibrating section bends to the opposite side to the base body side than the one end, the distance between the other end of the vibrating section and the base body can be set larger than the distance between the one end of the vibrating section and the base body.

APPLICATION EXAMPLE 5

According to this application example of the invention, in the piezoelectric generator according to the above application example of the invention, it is preferable that the piezoelectric body is formed of a plurality of layers stacked one another.

According to this configuration, since the piezoelectric body is composed of a plurality of layers, it becomes easier to obtain the desired thickness of the piezoelectric body, and it becomes possible to make the thickness of the layer more uniform compared to the case in which the piezoelectric body is made of a single layer. Thus, the breakage and the leakage between the first electrode and the second electrode due to the variation in thickness of the piezoelectric body can be prevented.

APPLICATION EXAMPLE 6

According to this application example of the invention, in the piezoelectric generator according to the above application example of the invention, it is preferable that to further provide a weight disposed on the other end side of the vibrating section.

According to this configuration, since the vibration of the vibrating section excited by the external vibration is promoted by the weight, the amplitude of the vibration of the vibrating section can further be increased. By controlling the weight of the weight, it is possible to control the natural frequency of the piezoelectric generator to thereby make it easy to resonate with the external vibration. Thus, since the current or the voltage output from the piezoelectric generator is increased, the piezoelectric generator efficiently generating electricity can be provided.

APPLICATION EXAMPLE 7

According to this application example of the invention, in the piezoelectric generator according to the above application example of the invention, it is preferable that two or more of the piezoelectric transducers are stacked on the base body.

According to this configuration, the electric energy due to the external vibration can be obtained from each of the plurality of piezoelectric transducers stacked on the base body. Thus, since the current or the voltage output from the piezoelectric generator is increased, the piezoelectric generator efficiently generating electricity can be provided.

APPLICATION EXAMPLE 8

According to this application example of the invention, there is provided a method of manufacturing a piezoelectric generator including: providing a base body layer, forming a sacrificial layer by disposing a paste including a material to be thermally decomposed in a partial area on the base body layer using a printing process, disposing a first electrode layer so as to straddle the base body layer and the sacrificial layer using a printing process, disposing a piezoelectric body layer in paste form including piezoelectric particles on the first electrode layer using a printing process, disposing a second electrode layer on the piezoelectric body layer using a printing process, and fireing the base body layer, the sacrificial layer, the first electrode layer, the piezoelectric body layer, and the second electrode layer.

According to this configuration, since each of the layers, namely the sacrificial layer, the first electrode layer, the piezoelectric layer, and the second electrode layer is disposed using the printing process, the expensive vacuum (low-pressure) deposition device is not required. Since by fireing these layers, the sacrificial layer is thermally decomposed and eliminated to thereby form the piezoelectric transducer composed of the first electrode, the piezoelectric body, and the second electrode to have a cantilevered shape, the complicated process using the photolithography process and the etching process for patterning and elimination of the sacrificial layer can be made unnecessary. As a result, the manufacturing manhour and the manufacturing cost of the piezoelectric generator can be reduced. The printing process mentioned here includes a screen printing process and a droplet ejection process such as an inkjet process.

APPLICATION EXAMPLE 9

According to this application example of the invention, in the method of manufacturing a piezoelectric generator according to the above application example of the invention, it is preferable that there is further provided the step of performing, prior to the fireing the base body layer, an isostatic pressing process on the base body layer, the sacrificial layer, the first electrode layer, the piezoelectric body layer, and the second electrode layer, and in the providing the base body layer, as the base body layer, there is prepared a ceramic sheet on which ceramics to be fireed including the same component as a component of the piezoelectric body layer is disposed.

According to this configuration, since the ceramic sheet to be fireed is used as the base body layer, it becomes possible to form the base body to have an arbitrary shape when fireed. In the step of performing the isostatic pressing process, since the restriction to the part having contact with the base body layer in the surface direction is smaller compared to the case in which the base body layer has already been fireed, the isostatic pressing process can efficiently be performed. Thus, the density of the piezoelectric particles in the piezoelectric body layer is raised, and therefore, the piezoelectric characteristics can further be improved. Since the base body layer and the piezoelectric body layer include the same component, the difference between the both layers in contraction rate in the fireation process becomes smaller and the diffusion of impurities from the base body layer to the piezoelectric body layer becomes smaller compared to the case in which the components of the base body layer and the piezoelectric body layer are different from each other. Thus, generation of cracks and residual stress in the base body layer and the piezoelectric body layer due to the large difference in contraction rate, and deterioration in the piezoelectric characteristics of the piezoelectric body layer due to the diffusion of the impurities can be prevented.

APPLICATION EXAMPLE 10

This application example of the invention is directed to a sensor node including a sensor, a circuit adapted to process data obtained by the sensor, a communication system adapted to communicate the data obtained by the sensor, and a power source adapted to drive the sensor, the communication system, and the circuit, wherein one of the piezoelectric generator according to the above application examples and the piezoelectric generator manufactured by the method according to the above application examples is provided as the sensor and the power source.

According to this configuration, since the piezoelectric generator, which efficiently generates electricity due to an external vibration, is provided as the power source, power source replacement of the sensor node can also be made unnecessary. Since the piezoelectric generator, which can be manufactured at low cost, functions as not only the power source but also the sensor, the low-price sensor node can be provided. Further, since the base body of the piezoelectric generator can be formed to have an arbitrary shape, the freedom of installation can be enhanced compared to the case in which the base body is formed of a silicon substrate or the like.

BRIEF DESCRIPTION OF THE DRAWINGS

The invention will be described with reference to the accompanying drawings, wherein like numbers reference like elements.

DESCRIPTION OF EXEMPLARY EMBODIMENTS

Some embodiments of the invention will hereinafter be explained with reference to the accompanying drawings. In each of the drawings referred to below, the dimensional ratio, angle, and so on of each of the constituents is appropriately made different from each other in order for showing the configuration in an easy-to-understand manner.

First Embodiment

Configuration of Piezoelectric Generator

Figure 1A:
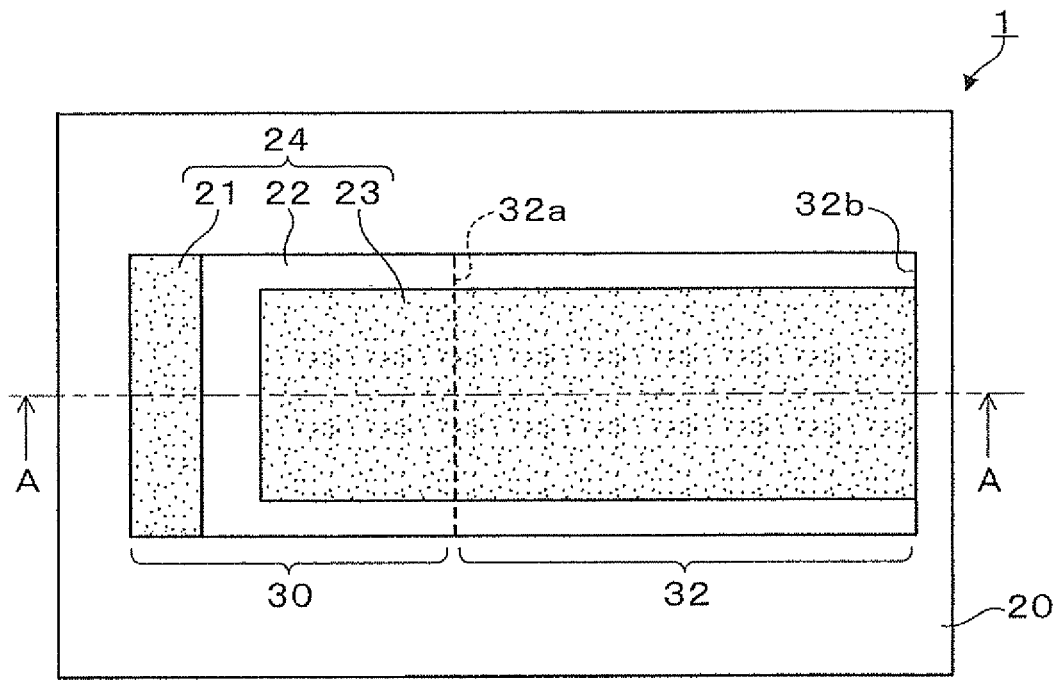
FIGS. 1A and 1B are schematic diagrams showing a schematic configuration of a piezoelectric generator according to a first embodiment of the invention.
Figure 1B:
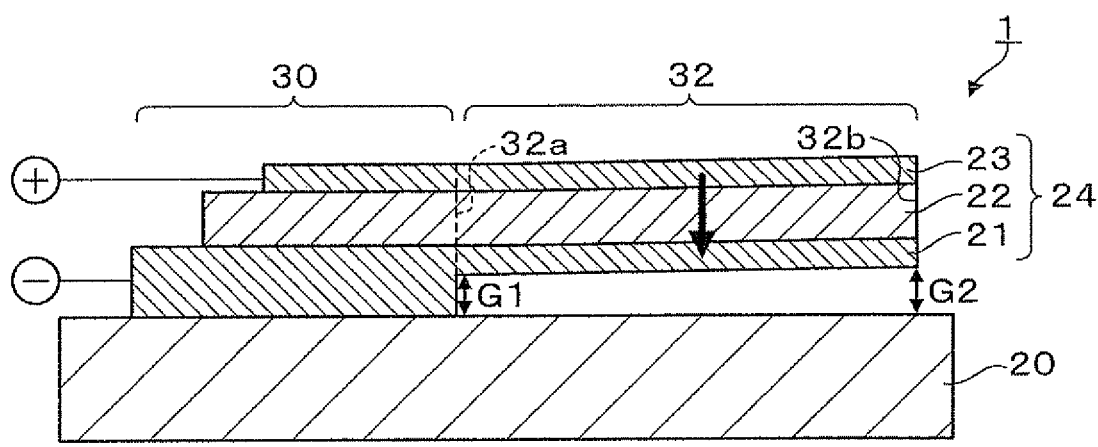

Firstly, a schematic configuration of the piezoelectric generator according to a first embodiment of the invention will be explained with reference to FIGS. 1A and 1B. FIGS. 1A and 1B are schematic diagrams showing a schematic configuration of the piezoelectric generator according to the first embodiment. For details, FIG. 1A is a schematic plan view of the piezoelectric generator, and FIG. 1B is a schematic cross-sectional view along the line A-A shown in FIG. 1A.

As shown in FIGS. 1A and 1B, the piezoelectric generator 1 according to the first embodiment is provided with a base body 20, and a piezoelectric transducer 24 including a first electrode 21, a piezoelectric body 22, and a second electrode 23 disposed in a stacked manner sequentially on the base body 20. The base body 20 is made of a ceramic material including the same component as the piezoelectric body 22. In the present embodiment, the base body 20 is made of the same constituent material as that of the piezoelectric body 22. The thickness of the base body 20 is, for example, in a range of 0.01 mm through 1 mm.

The piezoelectric transducer 24 has a support section 30 and a vibrating section 32. The support section 30 is a part of the piezoelectric transducer 24, fixed to the base body 20. The vibrating section 32 is a part of the piezoelectric transducer 24, shaped like a cantilever and disposed apart upward from the base body 20. The vibrating section 32 has one end 32a connected to the support section 30, and the other end 32b as a free end, and vibrates due to the vibration applied externally thereto. When applying distortion to a piezoelectric material on which the polarization process is performed, charge is generated inside the piezoelectric material in a direction for canceling the distortion. In FIG. 1B, the arrow indicates the polarization direction, and the charge (+, −) denotes the charge generated when the vibrating section 32 swings downward (toward the base body 20). In the piezoelectric transducer 24, the vibrating section 32 bends to cause distortion due to the vibration to thereby generate electric energy due to the piezoelectric effect.

The distance G2 between the other end 32b of the vibrating section 32 and the base body 20 is larger than the distance G1 between the one end 32a thereof and the base body 20 (see FIG. 1B). In other words, the vibrating section 32 has a shape formed by bending the part thereof on the other end 32b side upward (toward the opposite side to the base body 20). Therefore, since the vibrational amplitude of the vibrating section 32 excited by the external vibration can be increased compared to the case in which the distance from the base body 20 is the same between the one end 32a and the other end 32b, the amount of distortion caused in the piezoelectric transducer 24 is enlarged. Thus, it becomes possible to make the electric energy generated by the piezoelectric transducer 24 larger.

The first electrode 21 is a part of the piezoelectric transducer 24, disposed the nearest to the base body 20. The first electrode 21 is made of, for example, an alloy of silver (Ag) and palladium (Pd). The thickness of the first electrode 21 is, for example, in a range of 1 μm through 5 μm.

The piezoelectric body 22 is disposed on the first electrode 21. The piezoelectric body 22 is formed to have one side of the support section 30 smaller than that of the first electrode 21, for example, so that an area for connecting a wire to the first electrode 21 as the lower layer is exposed. The piezoelectric body 22 is formed of two piezoelectric body layers stacked one another (see FIG. 3E). The piezoelectric body is made of a piezoelectric material such as lead zirconium titanate (Pb(Zr, Ti)O$_3$; PZT), barium titanate (BaTiO$_3$), potassium niobate (KNbO$_3$), Pb(Mg, Nb)O$_3$—PbTiO$_3$, Pb(Zn, Nb)O$_3$—PbTiO$_3$. The thickness of the piezoelectric body 22 is, for example, in a range of 3 μm through 40 μm.

The second electrode 23 is disposed on the piezoelectric body 22. The second electrode 23 is formed to have, for example, the three sides, namely the sides except the side of the other end 32b, one size smaller than those of the piezoelectric body 22 so as not to cause contact or leakage with the first electrode 21 as the lower layer across the piezoelectric body 22. The second electrode 23 is made of, for example, an alloy of silver (Ag) and palladium (Pd). The thickness of the second electrode 23 is, for example, in a range of 1 μm through 5 μm.

Although in FIG. 1B, the first electrode 21 is illustrated so as to have a thickness different between the support section 30 and the vibrating section 32, the invention is not limited to such a configuration. It is also possible that the thickness of the first electrode 21 is substantially the same between the support section 30 and the vibrating section 32, and the whole of the piezoelectric transducer 24 bends upward at the one end 32a to thereby form the shape of the cantilevered vibrating section 32.

Method of Manufacturing Piezoelectric Generator

Figure 2:
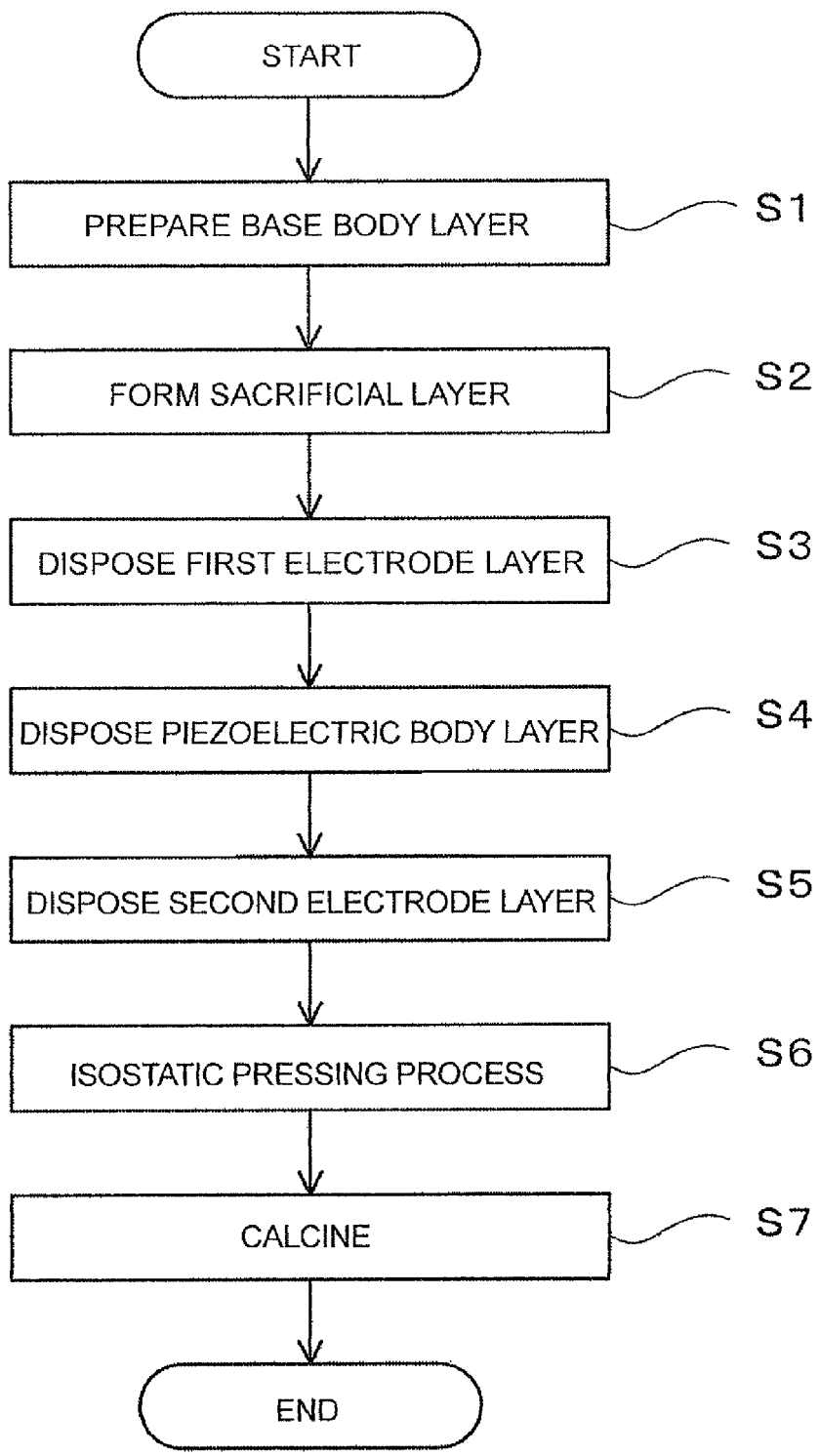
FIG. 2 is a flowchart showing a method of manufacturing the piezoelectric generator according to the first embodiment.

Subsequently, a method of manufacturing the piezoelectric generator according to the first embodiment will be explained with reference to FIGS. 2, 3A through 3E, and 4A through 4C. FIG. 2 is a flowchart showing the method of manufacturing the piezoelectric generator according to the first embodiment. FIGS. 3A through 3E and 4A through 4C are schematic cross-sectional diagrams showing the method of manufacturing the piezoelectric generator according to the first embodiment.

As shown in FIG. 2, the method of manufacturing the piezoelectric generator according to the first embodiment is provided with a step (step S1) of preparing the base body layer, a step (step S2) of forming a sacrificial layer, a step (step S3) of disposing the first electrode layer, a step (step S4) of disposing the piezoelectric body layer, a step (step S5) of disposing the second electrode layer, a step (step 6) of performing an isostatic pressing process, and a fireation step (step S7).

Figure 3A:
FIGS. 3A through 3E are schematic cross-sectional diagrams showing the method of manufacturing the piezoelectric generator according to the first embodiment.

As shown in FIG. 3A, in the step S1, a base body layer 10 is prepared. As a material of the base body layer 10, there is prepared a mixed solution obtained by adding powder of the piezoelectric material such as lead zirconium titanate (Pb(Zr, Ti)O$_3$; PZT) to a solvent such as ethanol, butanol, toluene, or terpineol, a binder such as polyvinyl alcohol or polyvinyl butyral, a dispersant such as a polycarboxylate dispersant, and a plasticizer such as dioctyl adipate. By mixing the mixed solution and then performing cracking thereon using a planetary ball mill or the like, a slurry (paste) with a piezoelectric material preferably dispersed is prepared. By applying the slurry to the surface of a film 15 and then drying it, a ceramic sheet having the base body layer 10 to be fireed disposed on the film 15 can be obtained. The thickness of the base body layer 10 is set, for example, in a range of 0.01 mm through 1 mm. It is also possible to form the base body layer 10 by stacking a plurality of layers if necessary.

Figure 3B:
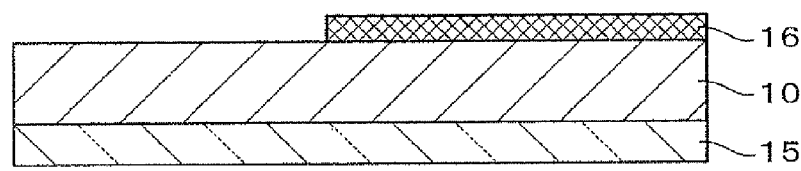

As shown in FIG. 3B, in the step S2, a sacrificial layer 16 is formed in a certain area on the base body layer 10. As a material of the sacrificial layer 16, for example, there is prepared a mixed solution obtained by dissolving the binder such as ethyl cellulose in the solvent of terpineol and then adding particles of a material made of carbon to be thermally decomposed. By dispersing and kneading the mixed solution using a three-roll mill or the like, a paste including a material to be thermally decomposed is prepared. By disposing the paste on the base body layer 10 using, for example, a screen printing process, and then drying it, the sacrificial layer 16 can be obtained. The thickness of the sacrificial layer 16 is set, for example, in a range of 2 μm through 20 μm.

Figure 3C:
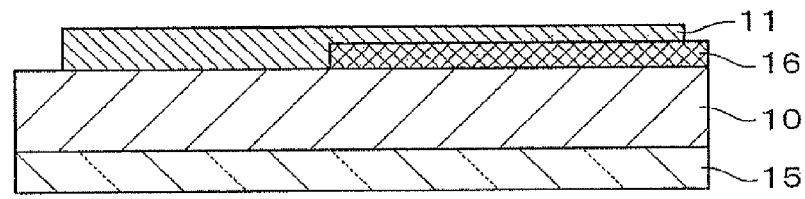

As shown in FIG. 3C, in the step S3, a first electrode layer 11 is formed so as to straddle the surface of the base body layer 10 and the surface of the sacrificial layer 16. As a material of the first electrode layer 11, an electrode paste including, for example, silver (Ag) and palladium (Pd) at a weight ratio of 7:3 through 8:2 is used, and the viscosity of the electrode paste is controlled using a solvent such as terpineol if necessary. By disposing the electrode paste on the surface of the base body layer 10 and the surface of the sacrificial layer 16 using, for example, a screen printing process, and then drying it, the first electrode layer 11 can be obtained. The thickness of the first electrode layer 11 is appropriately adjusted so that the thickness of the first electrode 21 after fireation becomes, for example, in a range of 1 μm through 5 μm.

Although in FIG. 3O the first electrode is illustrated to have a thickness different between the surface of the base body layer 10 and the surface of the sacrificial layer 16, it is also possible that the thickness of the first electrode layer 11 is substantially the same between the surface of the base body layer 10 and the surface of the sacrificial layer 16.

Figure 3D:
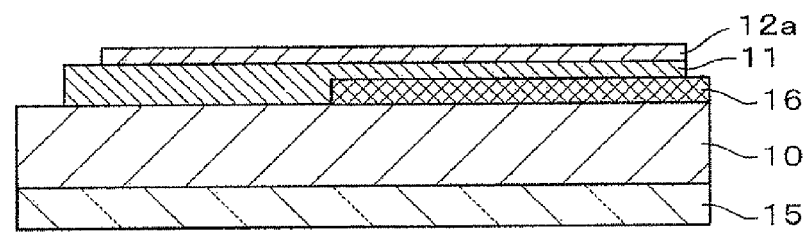
Figure 3E:
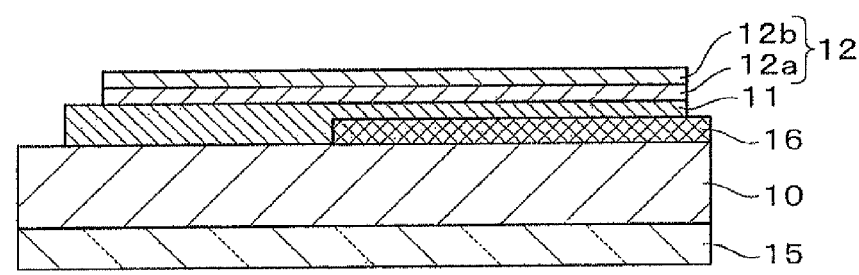

As shown in FIGS. 3D and 3E, in the step S4, a piezoelectric body layer 12 is formed on the first electrode layer 11. In the present embodiment, a slurry made of the same material as that of the base body layer 10 is used as the material of the piezoelectric body layer 12. The slurry is disposed on the first electrode layer 11 using, for example, a screen printing process, and is then dried. As shown in FIG. 3D, in the present embodiment, a piezoelectric body layer 12a is firstly disposed on the first electrode layer 11, and is then dried. As shown in FIG. 3E, a piezoelectric body layer 12b is disposed on the piezoelectric body layer 12a, and is then dried. Thus, the piezoelectric body layer 12 having the piezoelectric body layers 12a, 12b stacked one another can be obtained. Here, the thicknesses of the piezoelectric body layers 12a, 12b are appropriately controlled so that the thickness of the piezoelectric body 22 after fireation becomes, for example, in a range of 3 μm through 40 μm. The piezoelectric body layer 12 is disposed so that the first electrode layer 11 as the lower layer is exposed in one side.

It is also possible to form the piezoelectric body layer 12 with a single layer of the piezoelectric body layer 12a in the step S4. However, by forming the piezoelectric body layer 12 with the two layers as described above, it becomes easier to obtain the desired thickness and it becomes possible to make the thickness of the layer more uniform compared to the case of forming the piezoelectric body layer 12 with a single layer. Thus, the breakage and the leakage between the first electrode 21 and the second electrode 23 after the fireation due to the variation in thickness of the piezoelectric body layer 12 can be prevented. The piezoelectric body layer 12 can also be composed of three or more layers by further stacking the piezoelectric body layer on the piezoelectric body layers 12a, 12b.

Figure 4A:
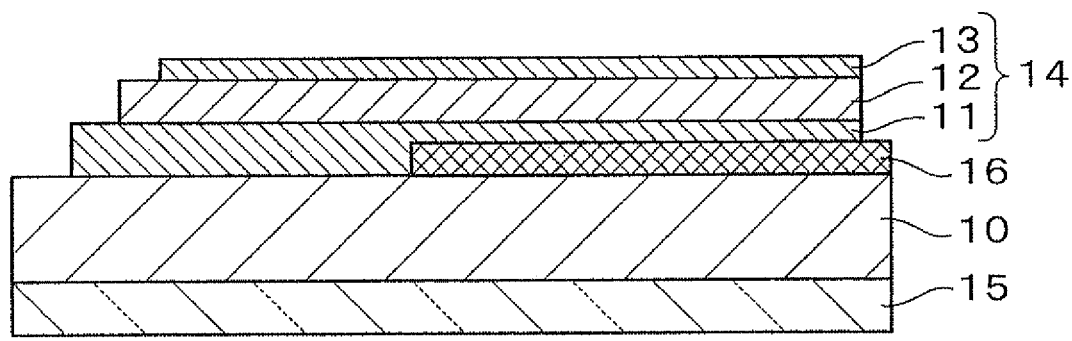
FIGS. 4A through 4C are schematic cross-sectional diagrams showing the method of manufacturing the piezoelectric generator according to the first embodiment.

As shown in FIG. 4A, in the step S5, a second electrode layer 13 is disposed on the piezoelectric body layer 12. The second electrode layer 13 is formed by disposing the same material as that of the first electrode layer 11 on the piezoelectric body layer 12 using, for example, a screen printing process, and then drying it. The second electrode layer 13 is disposed in an area one size smaller than the piezoelectric body layer 12 in, for example, three sides thereof. The first electrode layer 11, the piezoelectric body layer 12, and the second electrode layer 13 constitute a piezoelectric transducer layer 14.

Here, the first electrode layer 11, the piezoelectric body layer 12, and the second electrode layer 13 constituting the piezoelectric transducer layer 14 are individually shrunk by the fireation in the fireation step in the step S7 described later. In order for providing the vibrating section 32 of the piezoelectric transducer 24 obtained as a result of the fireation with the shape having the portion of the other end 32b bending upward as shown in FIG. 1B, it is preferable that the thermal contraction rate of the first electrode layer 11 is lower than the thermal contraction rate of the piezoelectric body layer 12, and that the thermal contraction rate of the second electrode layer 13 is higher than the thermal contraction rate of the piezoelectric body layer 12. The thermal contraction rate of each of the layers of the piezoelectric transducer layer 14 can be controlled by an amount of resin material such as polyvinyl butyral, polyvinyl alcohol, water-soluble polyurethane, or methyl cellulose to be added to the material of each of the layers. In other words, the larger the additive amount of the resin material is, the higher the thermal contraction rate can be set. Therefore, by appropriately controlling the amount of resin material described above to be added to each of the layers, namely the first electrode layer 11, the piezoelectric body layer 12, and the second electrode layer 13, to thereby adjust the thermal contraction rate, the vibrating section 32 (the piezoelectric transducer 24) having such a shape as shown in FIG. 1B can be obtained.

The printing process for disposing the layers in the respective steps, namely the step S2, the step S3, the step S4, and the step S5 is not limited to the screen printing process. As such a printing process, a droplet ejection process such as an inkjet process or a dispenser process, or any other printing process can also be adopted providing a predetermined outer shape (a pattern shape) and a predetermined layer thickness can be obtained using the printing process.

Figure 4B:
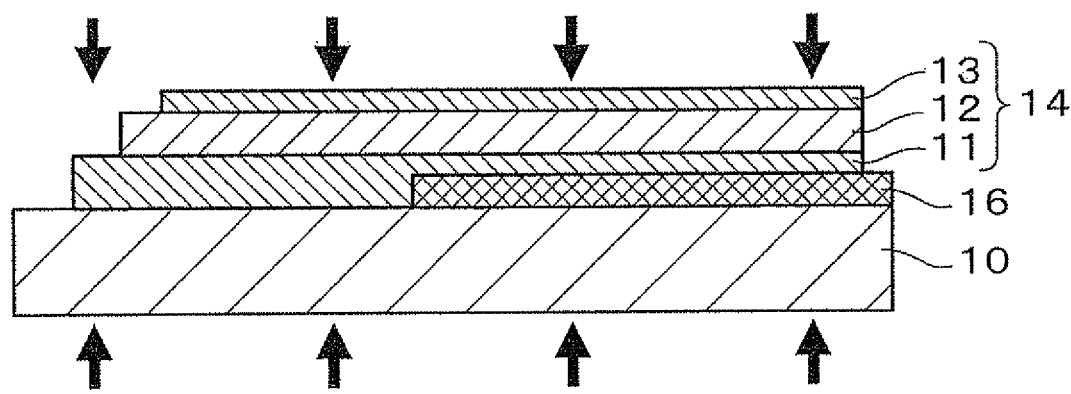

Subsequently, in the step S6, a cold isostatic pressing (CIP) process, for example, is performed on the sacrificial layer 16 and the piezoelectric transducer layer 14 disposed on the base body layer 10 as the isostatic pressing process as shown in FIG. 4B. By performing the isostatic pressing process, the density of the particles of the piezoelectric material can be raised in the piezoelectric body layer 12. Prior to the isostatic pressing process in the step S6, the film 15 is exfoliated.

In the step S6, if the base body layer 10 is the ceramics already fireed, the sacrificial layer 16 and the first electrode 11 disposed on the base body layer 10 are held in the surfaces having contact with the base body layer 10, and therefore, the isostatic pressing in the surface direction becomes difficult to perform. In contrast thereto, according to the present embodiment, since the base body layer 10 is not yet fireed and has flexibility, the restriction to the surface having contact with the base body layer 10 is reduced, and therefore, preferable efficiency of the isostatic pressing process can be obtained. Thus, the density of the piezoelectric particles in the piezoelectric body layer 12 is raised, and therefore, the piezoelectric characteristics of the piezoelectric body 22 can be improved.

As the isostatic pressing process, a warm isostatic pressing (WIP) process can also be adopted. By performing the warm isostatic pressing process, the adhesiveness between the piezoelectric body layer 12 and both of the first electrode layer 11 and the second electrode layer 13 can be enhanced.

Figure 4C:
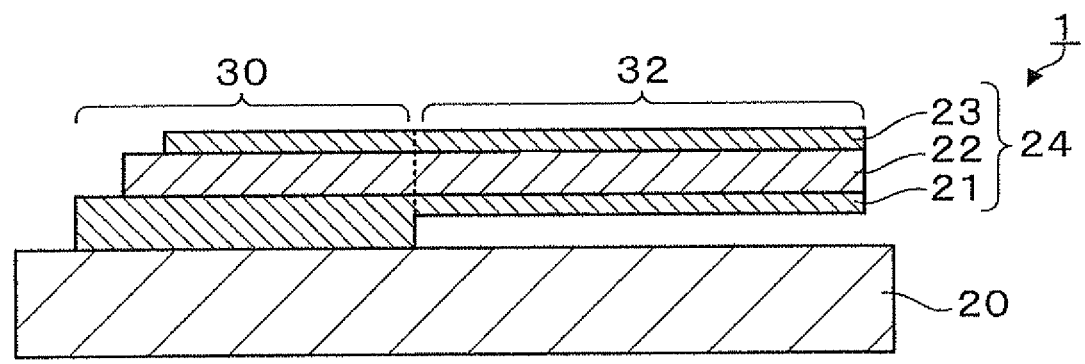

The step S7 is the fireation step of fireing the base body layer 10, the sacrificial layer 16, and the piezoelectric transducer layer 14. In the step S7, as shown in FIG. 4C, the material of the sacrificial layer 16 is thermally decomposed and then removed by, for example, the fireation at the temperature no higher than 1200° C. in the atmosphere. The base body layer 10 and the respective layers of the piezoelectric transducer layer 14 are fireed to thereby form the piezoelectric transducer 24, which is composed of the first electrode 21, the piezoelectric body 22, and the second electrode 23, and has the support section 30 and the cantilevered vibrating section 32, on the base body 20.

In the step S7, since the ceramic sheet not yet fireed is used as the base body layer 10, it becomes possible to firee the base body layer 10 while forming an arbitrary shape such as a curved shape. Since the base body layer 10 and the piezoelectric body layer 12 include the same component, the difference between the both layers in contraction rate in the fireation process becomes smaller and the diffusion of impurities from the base body layer 10 to the piezoelectric body layer 12 becomes smaller compared to the case in which the components of the base body layer 10 and the piezoelectric body layer 12 are different from each other. Thus, generation of cracks and residual stress in the base body 20 and the piezoelectric body 22 due to the large difference in contraction rate, and deterioration in the piezoelectric characteristics of the piezoelectric body 22 due to the diffusion of the impurities can be prevented in the fireation process.

According to the steps S1 through S7 described hereinabove, the piezoelectric generator 1 shown in FIGS. 1A and 1B is manufactured.

Configuration of Sensor Node

Figure 5:
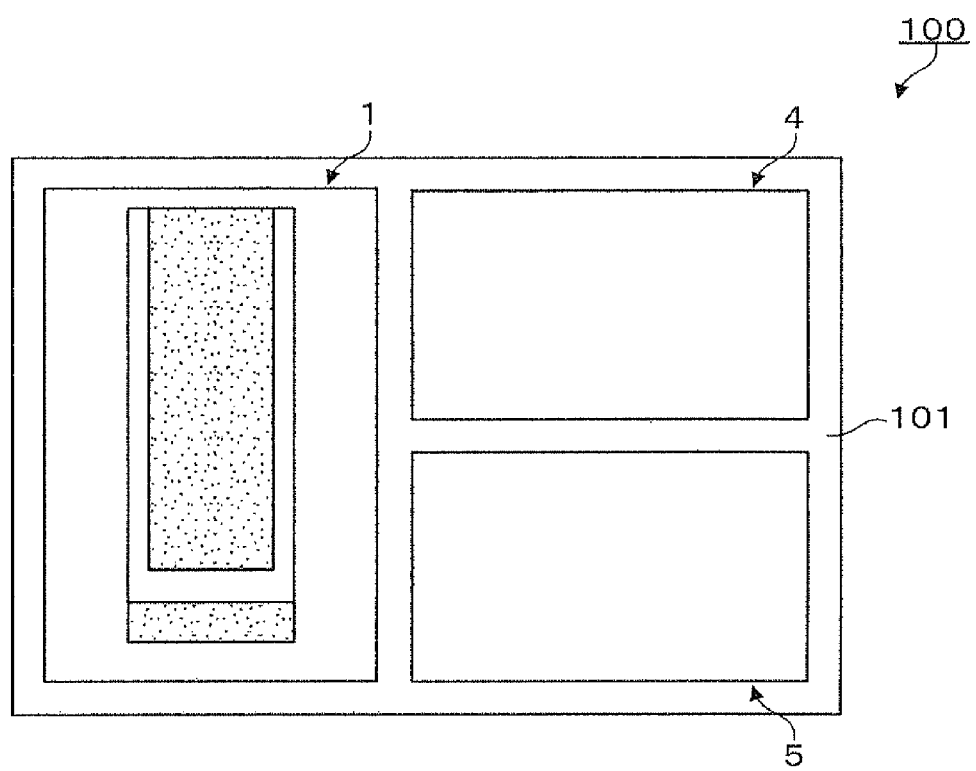
FIG. 5 is a schematic diagram showing a schematic configuration of a sensor node according to the first embodiment.

Then, a configuration of a sensor node according to the first embodiment will be explained with reference to FIG. 5. FIG. 5 is a schematic diagram showing a schematic configuration of the sensor node according to the first embodiment.

As shown in FIG. 5, the sensor node 100 according to the first embodiment is provided with the piezoelectric generator 1 disposed on the base body 101, a circuit 4, and a communication system 5. The sensor node 100 is used as a terminal of a sensor network (not shown). The sensor network is a network connecting the sensor nodes installed in a variety of places to each other, and makes it possible to collect data such as environmental information obtained by the sensor nodes, and for example, determine the circumstances in a specific area in a comprehensive manner based on the data thus collected. The sensor node is also installed in a place where the maintenance is difficult, and is therefore required to be able to efficiently generate electricity and operate for a long period of time, and have a maintenance-free power source not requiring battery replacement. Since a number of sensor nodes are installed in a variety of places, the sensor node is also required to be small in size, low-profile, and low in price.

In the sensor node 100, the piezoelectric generator 1 functions as a power source for driving the circuit 4 and the communication system 5. The piezoelectric generator 1 efficiently generates the electric energy due to the piezoelectric effect of the piezoelectric transducer 24, and can therefore be used preferably as the maintenance-free power source not requiring replacement. Since the piezoelectric generator 1 functions as a sensor for sensing the vibration and impact due to the piezoelectric effect of the piezoelectric transducer 24 provided with the vibrating section 32, no additional sensor is required.

The circuit 4 performs, for example, a process of comparing with the standard value on the data the piezoelectric generator 1 obtains as a sensor. The communication system 5 performs communication such as transmission of the data, which the piezoelectric generator 1 obtains as a sensor, to the network. The base body 101 is formed of, for example, a substrate, a film, or a material selected in accordance with the place where the sensor node 100 is installed.

Since the sensor node 100 according to the first embodiment is provided with the piezoelectric generator 1, which can be manufactured at low cost, and functions also as a sensor, a small-sized and low-price sensor node 100 can be provided. Since the base body 20 of the piezoelectric generator 1 can be formed to have an arbitrary shape, the freedom of installation of the sensor node 100 can be enhanced compared to the case in which the base body 20 is formed of a silicon substrate or the like.

The piezoelectric generator 1 can also be used as a sensor for sensing temperature or moisture by disposing a layer made of a material, which shrinks in accordance with an environmental variation other than a vibration or an impact, such as a variation in temperature, moisture, or the like, on the piezoelectric transducer 24. By adopting such a configuration, there can be provided the sensor node 100 capable of coping with the data acquisition of a variety of environmental information.

According to the configuration and the manufacturing method of the piezoelectric generator 1 related to the first embodiment described hereinabove, the following advantages can be obtained.

1. Since no other layer intervenes between the piezoelectric transducer 24 having the support section 30 and the vibrating section 32 and the base body 20, the piezoelectric generator 1 can be made low-profile. Since the other end 32b side of the vibrating section 32 bends upward, the amplitude of the vibration of the vibrating section 32 excited by an external vibration can be increased. Thus, the amount of the distortion caused in the piezoelectric transducer 24 is increased, and therefore, the electric energy generated by the piezoelectric generator 1 is increased. As a result, the piezoelectric generator 1, which is low-profile and efficiently generates electricity, can be provided.

2. Since the sacrificial layer 16 and the piezoelectric transducer layer 14 are disposed using a printing process in the manufacturing process, an expensive vacuum (low-pressure) deposition device is not required. Since the sacrificial layer 16 is thermally decomposed to be removed by firing the layers thus disposed to thereby form the piezoelectric transducer 24 to have the cantilevered shape, there can be eliminated the complicated process using the photolithography process and the etching process for patterning the piezoelectric transducer 24 and removing the sacrificial layer 16. As a result, the manufacturing man-hour and the manufacturing cost of the piezoelectric generator 1 can be reduced.

3. Since the piezoelectric body 22 is formed of the two layers, namely the piezoelectric body layers 12a, 12b, stacked one another, it becomes easy to obtain a desired layer thickness, and at the same time, the layer thickness can be made more uniform. Thus, the breakage and the leakage between the first electrode 21 and the second electrode 23 due to the variation in thickness of the piezoelectric body 22 can be prevented.

4. Since the ceramic sheet to be fireed is used as the base body layer 10, it becomes possible to form the base body 20 so as to have an arbitrary shape, and therefore, the freedom of installation can be enhanced. In the step of performing the isostatic pressing process, since the restriction to the part having contact with the base body layer 10 in the surface direction is small, the isostatic pressing process can efficiently be performed. Thus, the density of the piezoelectric particles in the piezoelectric body 22 is raised, and therefore, the piezoelectric characteristics can be improved.

5. Since the base body layer 10 includes the same component as that of the piezoelectric body layer 12, the difference between the both layers in contraction rate in the fireation process is reduced, and at the same time, the diffusion of the impurities from the base body layer 10 into the piezoelectric body layer 12 is also reduced. Thus, generation of cracks and residual stress in the base body 20 and the piezoelectric body 22 due to the large difference in contraction rate, and deterioration in the piezoelectric characteristics of the piezoelectric body 22 due to the diffusion of the impurities can be prevented. Further, since the base body layer 10 has flexibility, it becomes possible to form the base body 20 after the fireation process so as to have an arbitrary shape.

6. Since the thermal contraction rate of the first electrode layer 11 is lower than the thermal contraction rate of the piezoelectric body layer 12, the piezoelectric body layer 12 located upward makes larger contraction than the first electrode layer 11 due to the fireation. Therefore, in the piezoelectric transducer 24 after the fireation, since the other end 32b side of the vibrating section 32 bends upward, the distance between the other end 32b of the vibrating section 32 and the base body 20 can be made larger than the distance between the one end 32a of the vibrating section 32 and the base body 20.

7. Since the thermal contraction rate of the second electrode layer 13 is higher than the thermal contraction rate of the piezoelectric body layer 12, the second electrode layer located upward makes larger contraction than the piezoelectric body layer 12 due to the fireation. Therefore, in the piezoelectric transducer 24 after the fireation, since the other end 32b side of the vibrating section 32 bends upward, the distance between the other end 32b of the vibrating section 32 and the base body 20 can be made larger than the distance between the one end 32a of the vibrating section 32 and the base body 20.

8. Since the piezoelectric generator 1, which efficiently generates electricity due to an external vibration, is provided as the power source, power source replacement of the sensor node 100 can be made unnecessary. Since the piezoelectric generator 1, which can be manufactured at low cost, functions as not only the power source but also the sensor, the low-price sensor node 100 can be provided. Further, since the base body 20 of the piezoelectric generator 1 can be formed to have an arbitrary shape, the freedom of installation can be enhanced compared to the case in which the base body 20 is formed of a silicon substrate or the like.

Second Embodiment

Configuration of Piezoelectric Generator

Figure 6A:
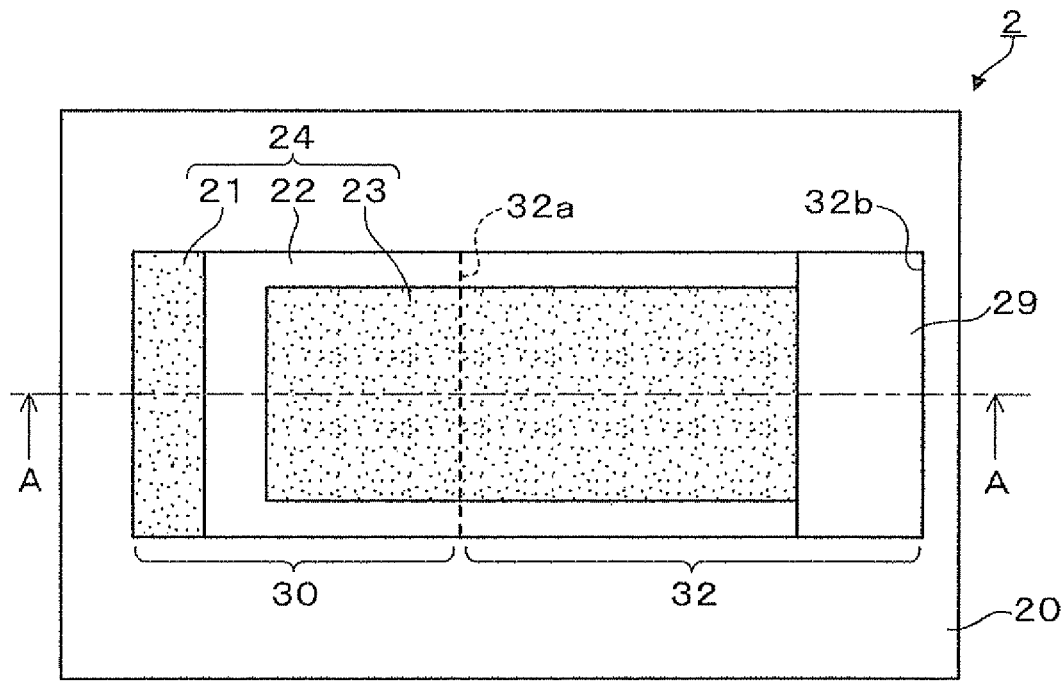
FIGS. 6A and 6B are schematic diagrams showing a schematic configuration of a piezoelectric generator according to a second embodiment of the invention.
Figure 6B:
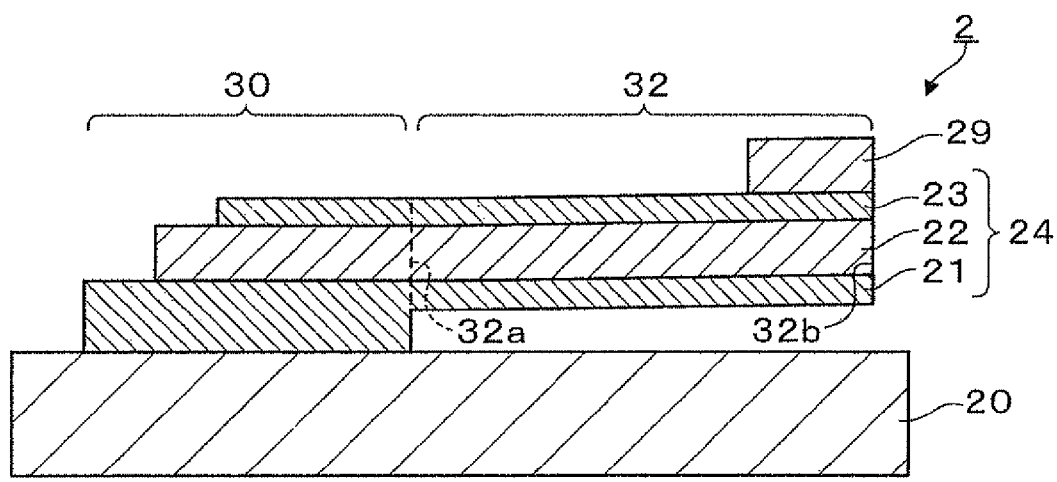

Then, a configuration of a piezoelectric generator according to a second embodiment will be explained with reference to FIGS. 6A and 6B. FIGS. 6A and 6B are schematic diagrams showing a schematic configuration of the piezoelectric generator according to the second embodiment. For details, FIG. 6A is a schematic plan view of the piezoelectric generator, and FIG. 6B is a schematic cross-sectional view along the line A-A shown in FIG. 6A.

The piezoelectric generator 2 according to the second embodiment is different from the piezoelectric generator 1 according to the first embodiment in the point that a weight 29 is disposed on the vibrating section 32, and is substantially the same in the rest of the configuration. Therefore, in the second embodiment, the constituents common to the first and second embodiments are denoted with the same reference symbols, and the explanation therefor will be omitted.

As shown in FIGS. 6A and 6B, the piezoelectric generator 2 according to the second embodiment is provided with the base body 20, the piezoelectric transducer 24 disposed on the base body 20, and the weight 29 disposed on the piezoelectric transducer 24. The weight 29 is disposed on the other end 32b side of the vibrating section 32 of the piezoelectric transducer 24. The weight 29 is formed in such a manner that dot-like clods are stacked, for example. Therefore, in FIGS. 6A and 6B, the weight 29 has a rectangular planar shape with a flat surface, but is not limited to such a shape.

By disposing the weight 29 on the vibrating section 32 (the piezoelectric transducer 24), the vibration of the vibrating section 32 excited by the external vibration is promoted by the weight 29, and therefore, the amplitude of the vibration of the vibrating section 32 can further be increased. As a result, since the electric energy generated by the piezoelectric transducer 24 can be increased compared to the case in which the weight 29 is not provided, the current or the voltage output from the piezoelectric generator 2 can also be increased.

By disposing the weight 29 on the vibrating section 32, the natural frequency of the piezoelectric generator 2 is lowered. By controlling the weight of the weight 29, the natural frequency of the piezoelectric generator 2 can be controlled. Since the output of the piezoelectric generator 2 becomes the largest when the frequency of the external vibration and the natural frequency of the piezoelectric generator 2 are equal to each other, by appropriately controlling the natural frequency of the piezoelectric generator 2 to thereby make it easy to resonate with the external vibration, it is possible to approximate the current or the voltage output from the piezoelectric generator 2 to the maximum.

Since the natural frequency of the piezoelectric generator 2 varies in accordance with the length and the thickness of the vibrating section 32, the natural frequency can be controlled by varying the length of the vibrating section or the thickness of the vibrating section 32 (the piezoelectric body 22). However, if the natural frequency is controlled using the weight of the weight 29 as in the piezoelectric generator 2, the natural frequency can easily be controlled without changing the dimensional setting of the vibrating section 32, and therefore, it becomes possible to easily cope with, for example, the installation environment with different external vibration.

The manufacturing method of the piezoelectric generator 2 according to the second embodiment is different from the manufacturing method of the piezoelectric generator 1 according to the first embodiment in the point that a step of forming the weight 29 is further provided after the fireation step in the step S7. As the material of the weight 29, there can be used either one of an organic matter such as light curing resin, an inorganic matter such as Si, $SiO_2$, or $ZrO_2$, a metal such as Au, Ag, or Cu, a resist, and so on.

In the method of forming the weight 29, a plurality of dot-like clods made of the material of the weight 29 is disposed on the piezoelectric transducer 24 using, for example, an inkjet process or a dispenser process. Thus, the weight 29 is formed, and the weight of the weight 29 can be controlled by the number (amount) of the dot-like clods. It is preferable that the place where the weight 29 is disposed is set so that the amplitude of the vibration of the vibrating section 32 becomes the largest. By directly forming the weight 29 using the inkjet process, the dispenser process, or the like, the complicated manufacturing process is not required, and therefore, the productivity can be improved.

The piezoelectric generator 2 according to the second embodiment can be used as the sensor and the power source of the sensor node 100 according to the first embodiment. By providing the sensor node 100 with the piezoelectric generator 2, the current or the voltage supplied from the piezoelectric generator 2 as a power source can be made larger. Since the natural frequency of the piezoelectric generator 2 can easily be controlled, it is possible to easily cope with the installation environment of the sensor node 100.

Although the piezoelectric generator according to the invention is hereinabove explained based on the embodiments described above, the invention is not limited to these embodiments, and various modifications can be made within the scope of the invention. The following modified examples are possible.

Figure 7A:
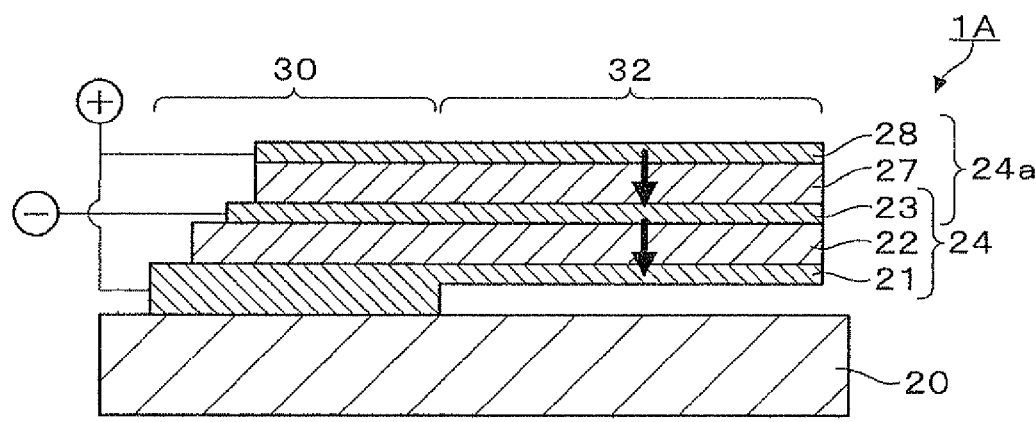
FIGS. 7A through 7C are diagrams showing a schematic configuration of a piezoelectric generator according to a modified example.
Figure 7B:
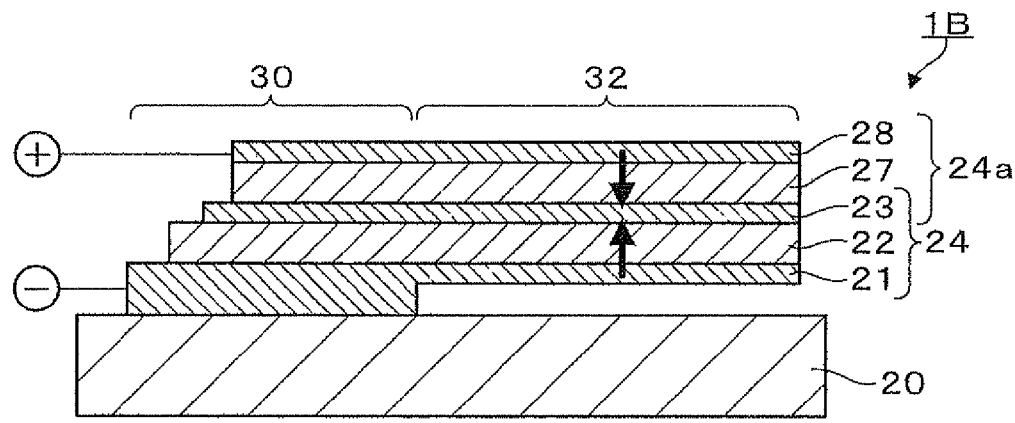
Figure 7C:
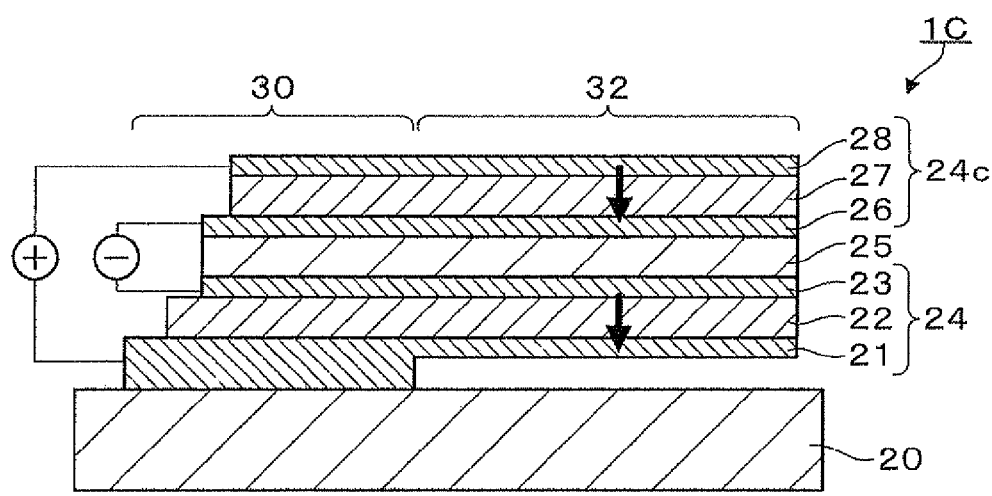

Although the piezoelectric generator 1 according to the first embodiment has the configuration of disposing a layer of the piezoelectric transducer 24 (the first electrode 21, the piezoelectric body 22, and the second electrode 23), the invention is not limited to such a configuration. It is also possible for the piezoelectric generator to have a configuration of stacking a plurality of piezoelectric transducers on the base body 20. FIGS. 7A through 7C are diagrams showing a schematic configuration of a piezoelectric generator according to a modified example. For details, FIGS. 7A, 7B, and 7C are schematic cross-sectional diagrams of the piezoelectric generators having the respective configurations different from each other. The constituents common to the embodiments described above and the modified example are denoted with the same reference symbols, and the explanation therefor will be omitted.

First Modified Example

A piezoelectric generator 1A shown in FIG. 7A is further provided with a piezoelectric body 27 and a third electrode 28 stacked on the piezoelectric transducer 24 (the first electrode 21, the piezoelectric body 22, and the second electrode 23). In the piezoelectric generator 1A, a piezoelectric transducer 24a is composed of the second electrode 23, the piezoelectric body 27, and the third electrode 28. The second electrode 23 is also functions as the electrode in the piezoelectric transducer 24a. Therefore, the piezoelectric generator 1A is different from the piezoelectric generator 1 according to the first embodiment in a point that the piezoelectric transducer 24a stacked on the piezoelectric transducer 24 is provided.

According to the piezoelectric generator 1A, the electric energy due to the external vibration can be obtained from each of the plurality of piezoelectric transducers 24, 24a stacked on the base body 20. As indicated by the arrows in FIG. 7A, since the polarization direction of the piezoelectric transducer 24 and the polarization direction of the piezoelectric transducer 24a are the same, the piezoelectric generator 1A is capable of increasing the current to be output compared to the piezoelectric generator 1 according to the first embodiment. Thus, the piezoelectric generator 1A efficiently generating electricity can be provided.

Second Modified Example

A piezoelectric generator 1B shown in FIG. 7B has a configuration of stacking the piezoelectric transducer 24a on the piezoelectric transducer 24 similarly to the piezoelectric generator 1A according to the first modified example. It should be noted that the way of wiring is different, and the polarization direction is reversed between the piezoelectric transducer 24 and the piezoelectric transducer 24a. According to such a configuration, the piezoelectric generator 1B is capable of increasing the voltage to be output compared to the piezoelectric generator 1.

Third Modified Example

A piezoelectric generator 1C shown in FIG. 7C is provided with an insulating layer 25 disposed on the piezoelectric transducer 24 (the first electrode 21, the piezoelectric body 22, and the second electrode 23), and is further provided with a fourth electrode 26, a piezoelectric body 27, and a third electrode 28 sequentially stacked on the insulating layer 25. The fourth electrode 26, the piezoelectric body 27, and the third electrode 28 constitute a piezoelectric transducer layer 24c. Therefore, the piezoelectric generator 1C is different from the piezoelectric generator 1 in the point that the piezoelectric transducer 24c is stacked on the piezoelectric transducer 24 via the insulating layer 25.

In the piezoelectric generator 10, the polarization direction of the piezoelectric transducer 24 and the polarization direction of the piezoelectric transducer 24c are the same, and therefore, the configuration similar to that of the piezoelectric generator 1A according to the first modified example is provided. According to such a configuration, the piezoelectric generator 10 is capable of increasing the current to be output similarly to the piezoelectric generator 1A.

Compared to the piezoelectric generator 1A, since the thickness of the vibrating section 32 increases as much as the thickness of the insulating layer 25 and the fourth electrode 26 in the piezoelectric generator 1C, the natural frequency is raised. In other words, according to the configuration of the piezoelectric generator 10, the natural frequency of the piezoelectric generator 1C of the vibrating section 32 can be controlled by varying the layer thickness or the material of the insulating layer 25. Therefore, it is possible to control the natural frequency of the piezoelectric generator 10 without varying the length of the vibrating section 32 or the thickness of the piezoelectric bodies 22, 27, and so on.

As the material of the insulating layer 25, there is preferably used the material, which is the same as the constituent material of the piezoelectric bodies 22, 27, but in which no polarization is caused. If a material different from the constituent material of the piezoelectric bodies 22, 27 is used as the material of the insulating layer 25, there is a possibility that the component of the material of the insulating layer 25 diffuses into the piezoelectric bodies 22, in the fireation process to thereby deteriorate the piezoelectric characteristics of the piezoelectric bodies 22, 27.

It is also possible to adopt a configuration of providing the piezoelectric generators 1A, 1B, and 10 of the first, second, and third modified examples with the weight 29 of the second embodiment. By providing the piezoelectric generators 1A, 1B, and 10 with the weight 29, the amplitude of the vibration of the vibrating section 32 can further be enlarged, and at the same time, the natural frequency can easily be controlled. It is also possible to adopt a configuration of using one of the piezoelectric generators 1A, 1B, and 10 of the first, second, and third modified examples as the sensor and the power source of the sensor node 100 according to the first embodiment.

This application claims priority to Japanese Patent Application No. 2010-230299, filed on Oct. 13, 2010, the entirety of which is hereby incorporated by reference.

What is claimed is:

1. A piezoelectric generator comprising:
   a base body; and
   at least one piezoelectric transducer disposed on the base body, and including a first electrode, a piezoelectric body, and a second electrode,
   wherein the piezoelectric transducer includes a support section fixed to the base body, and a vibrating section disposed apart from the base body, having one end connected to the support section and the other end set as a free end, and vibrating due to a vibration applied externally, and
   a distance between the other end of the vibrating section and the base body is larger than a distance between the one end of the vibrating section and the base body.

2. The piezoelectric generator according to claim 1, wherein
   the base body is made of a material including a component the same as a component of the piezoelectric body.

3. The piezoelectric generator according to claim 1, wherein
   a thermal contraction rate of the first electrode is lower than a thermal contraction rate of the piezoelectric body.

4. The piezoelectric generator according to claim 1, wherein
   a thermal contraction rate of the second electrode is higher than a thermal contraction rate of the piezoelectric body.

5. The piezoelectric generator according to claim 1, wherein
   the piezoelectric body is formed of a plurality of layers stacked one another.

6. The piezoelectric generator according to claim 1, further comprising:
   a weight disposed on the other end side of the vibrating section.

7. The piezoelectric generator according to claim 1, wherein
   two or more of the piezoelectric transducers are stacked on the base body.

8. A sensor node comprising:
   a sensor;
   a circuit adapted to process data obtained by the sensor;
   a communication system adapted to communicate the data obtained by the sensor; and
   a power source adapted to drive the sensor, the communication system, and the circuit,
   wherein the piezoelectric generator according to claim 1 is provided as the sensor and the power source.

9. A sensor node comprising:
   a sensor;
   a circuit adapted to process data obtained by the sensor;
   a communication system adapted to communicate the data obtained by the sensor; and
   a power source adapted to drive the sensor, the communication system, and the circuit,
   wherein the piezoelectric generator according to claim 2 is provided as the sensor and the power source.

10. A sensor node comprising:
    a sensor;
    a circuit adapted to process data obtained by the sensor;
    a communication system adapted to communicate the data obtained by the sensor; and
    a power source adapted to drive the sensor, the communication system, and the circuit,
    wherein the piezoelectric generator according to claim 3 is provided as the sensor and the power source.

11. A sensor node comprising:
    a sensor;
    a circuit adapted to process data obtained by the sensor;

a communication system adapted to communicate the data obtained by the sensor; and
a power source adapted to drive the sensor, the communication system, and the circuit,
wherein the piezoelectric generator according to claim 4 is provided as the sensor and the power source.

12. A sensor node comprising:
a sensor;
a circuit adapted to process data obtained by the sensor;
a communication system adapted to communicate the data obtained by the sensor; and
a power source adapted to drive the sensor, the communication system, and the circuit,
wherein the piezoelectric generator according to claim 5 is provided as the sensor and the power source.

13. A sensor node comprising:
a sensor;
a circuit adapted to process data obtained by the sensor;
a communication system adapted to communicate the data obtained by the sensor; and
a power source adapted to drive the sensor, the communication system, and the circuit,
wherein the piezoelectric generator according to claim 6 is provided as the sensor and the power source.

14. A sensor node comprising:
a sensor;
a circuit adapted to process data obtained by the sensor;
a communication system adapted to communicate the data obtained by the sensor; and
a power source adapted to drive the sensor, the communication system, and the circuit,
wherein the piezoelectric generator according to claim 7 is provided as the sensor and the power source.

* * * * *